(12) United States Patent
Ruegg et al.

(10) Patent No.: US 6,700,722 B2
(45) Date of Patent: Mar. 2, 2004

(54) HIGH-SPEED ZERO PHASE RESTART OF A MULTIPHASE CLOCK

(75) Inventors: Michael A. Ruegg, Santa Cruz, CA (US); Sasan Cyrusian, Scotts Valley, CA (US)

(73) Assignee: Infineon Technologies AG, Munich (DE)

( * ) Notice: Subject to any disclaimer, the term of this patent is extended or adjusted under 35 U.S.C. 154(b) by 231 days.

(21) Appl. No.: 09/865,787

(22) Filed: May 25, 2001

(65) Prior Publication Data

US 2002/0176299 A1 Nov. 28, 2002

(51) Int. Cl.⁷ .................................................. G11B 5/09
(52) U.S. Cl. .............................. 360/51; 713/503; 331/2; 375/371; 327/152
(58) Field of Search ..................... 360/51, 26; 713/503; 331/46, 56, 2, 136; 375/354, 373, 371; 327/291, 296, 295, 146, 144, 141, 152

(56) References Cited

U.S. PATENT DOCUMENTS 5,552,942 A * 9/1996 Ziperovich ................... 360/51
6,044,122 A * 3/2000 Ellersick ..................... 375/360

OTHER PUBLICATIONS

"Synchronous Recording Channels—PRML & Beyond", rev. 5.61 14.E.18, 1999, published by Knowledge Tek, Inc., Broomfield, Colorado.

"PRML: Seagate Uses Space Age Technology" available on the Internet at http://www.seagate.com/support/kb/disc/prml.html, 2 pages, last accessed Apr. 9, 2001.

"Technologies—PRML" available on the Internet at http://www.idema.org/about/industry/ind_tech_prml.html, 1 page, last accessed Apr. 9, 2001.

"Reference Guide—Hard Disk Drives" available on the Internet at http://www.storagereview.com/guide2000/ref/hdd. 13 pages, last accessed Apr. 9, 2001.

"MR and PRML: Technologies in Synergy" available at on the Internet at http://www.lionsgate.com/Home/Baden/public_html_index/SCSI/Quantum_White_Papers/MR_Head/MR, 4 pages, last accessed Apr. 9, 2001.

"A Tutorial on Convolutional Coding with Viterbi Decoding" available on the Internet at http://pw1.netcom.com/~chip.f/viterbi/tutorial.html, 10 pages, last accessed Apr. 9, 2001.

* cited by examiner

Primary Examiner—Alan T. Faber
(74) Attorney, Agent, or Firm—Brinks Hofer Gilson & Lione (57) ABSTRACT

A high speed zero phase restart for a multiphase clock for a PRML read/write channel design. The zero phase restart includes an input for receiving a plurality of clock pulse waves, each having substantially equal period and each being out of phase with respect to other clock pulse waves; an output including at least one output terminal corresponding to one of the clock pulse waves; and a zero phase circuit configured to sequentially couple the plurality of clock pulse waves to the corresponding output terminals.

12 Claims, 4 Drawing Sheets

HIGH-SPEED ZERO PHASE RESTART OF A MULTIPHASE CLOCK

BACKGROUND

The present invention relates generally to the field of magnetic data storage devices. More particularly, the present invention relates to partial response, maximum likelihood read/write channels for magnetic data storage designs.

Digital data processed by computers are often stored by a permanent data storage system, referred to as a hard disk or hard disk drive. The data generally consists of streams of 1's and 0's ("bits"). The hard disk includes a magnetic surface in which discrete magnetic fields can be programmed to represent the bits of data. In conventional hard disk designs, the stream of data is encoded and then programmed to the hard disk via a read/write head that passes over the magnetic surface. As the read/write head passes the magnetic surface, the read/write head polarizes segments of the surface to one of two magnetic field polarities. Thus, the encoded bits include a stream of magnetic field reversals.

Because the data is encoded as field reversals, it is desirable to locate a specific segment of the magnetic surface for individual bits. Runs of consecutive segments having the same polarity are undesirable because of difficulty with determining where one bit ends and where another begins. To keep track of bit location, clock synchronization data is encoded with the programmed data. The clock synchronization data provides references ("Clock References") when the data is read from the hard drive. However, the clock references use valuable space on the magnetic surface.

Data has generally been read using peak detection. When the read/write head passes a reversal in the magnetic field, a small voltage spike may be imparted on the read/write head. A peak detection read circuit, referred to as a read/write channel, is electrically coupled with the read/write head passing over the magnetic surface. The read/write channel interprets data read from the detected peaks based on encoding techniques used to program the data. The read/write channel converts the signal to digital information by continuously analyzing the data in synchronization with a clock and identifying the voltage spikes representing the magnetic field reversals.

The density in which data can be stored with peak detection methods is limited due to, for example, interference of closely packed magnetic peaks. Due to the limited physical space on the hard disk, the amount of stored data is optimized by increasing the areal density in which the data can be stored. However, the goal of optimizing the density of the data stored on the hard disk is balanced with optimizing the reliability of the data read from the disk. As the density increases, the intricacy with which individual data bits are distinguished and with which data is isolated from any background noise increases. As the density increases, the possibility of inter-symbol interference ("ISI") increases. Specifically, as the density increases, the strength of individual magnetic fields decreases.

Read/write channels based on partial response, maximum likelihood ("PRML") methods provide reliable data storage at increased densities, while requiring minimal clock references. This technology generally includes a two-part process: 1) Partial Response, and 2) Maximum Likelihood. For the partial response aspect, a read/write channel circuit implements complex digital signal processing ("DSP") and sampling algorithms to manipulate the stream of magnetic data coming from the read/write head. For the Maximum likelihood aspect, the read/write channel is configured to determine the most likely sequence of data that the stream of magnetic data represents. The stream of magnetic data from the read/write head is decoded in a process referred to as Viterbi Detection. During Viterbi Detection, an algorithm determines possible combinations of data, and the match with a least difference is the combination determined to have the maximum likelihood of being the correct data.

PRML read/write channels often include one or more oscillator circuits providing a multiphase clock signal used for synchronizing read and write operations. In general, the oscillator provides multiple clock pulse waves, each having substantially the same frequency and out of phase with respect to the other clock pulse waves. At power up, the oscillator often provides the clock pulse waves in random order. However, other circuits in the read/write channel provided with the clock signal require the multiphase clock signal to be provided in a predictable order. Specifically, the clock signal pulse waves having a zero phase start are sequentially provided according to respective phase for each clock signal pulse wave.

Circuits have been added to the oscillator to ensure a zero phase start. However, circuits added to the oscillator produce distortion in the multiphase clock pulse waves and slow the speed at which the oscillator can generate the multiphase clock signal. In addition, when the multiphase clock signal is reset, the oscillator circuit is reset, additionally requiring reset of any circuits relying on the multiphase clock signal. Other techniques for providing a zero phase restart include resetting the multiphase clock signal in one period of the pulse wave while slowing the clock pulse. This technique however, requires significant time and precise clock delay compensation.

Accordingly, there is a need in the art for a programmable high-speed zero phase restart circuit for a multiphase clock.

BRIEF SUMMARY

A high speed zero phase restart for a multiphase clock is disclosed. The high speed zero phase restart for a multiphase clock provides quick and reliable synchronization of pulse waves. The multiple pulse waves are sequentially coupled to terminals corresponding to the pulse wave, according to the pulse wave phase.

One embodiment of a high speed zero phase restart apparatus comprises an integrated circuit having an input, an output and a zero phase circuit. The input is configured to receive multiple clock pulse waves generated by a multiphase clock signal. Each clock pulse wave has substantially the same frequency and is out of phase with respect to the other clock pulse waves. The output includes output terminals, including at least one corresponding terminal for each of the clock pulse waves. The zero phase circuit is electrically coupled to both the input and the output. In response to a reset signal, the zero phase circuit sequentially in time couples each of the clock pulse waves to corresponding output terminals. The pulse waves are sequentially coupled so that a most-significant-phase clock pulse wave is the first signal coupled to the corresponding output and a least-significant-phase clock pulse wave is the last clock pulse wave coupled to the corresponding output terminal. After the pulse wave is coupled to the corresponding output, the output remains coupled until another reset signal is received at the zero phase circuit.

One embodiment of a method for a high speed zero phase restart includes restarting a multiphase clock signal by receiving a plurality of clock pulse waves; coupling a most-significant-phase clock pulse wave to a most-significant output terminal in response to a reset input signal; coupling at least one intermediate-phase clock pulse wave to an intermediate output terminal in response to coupling the most significant phase clock pulse wave; and coupling a least-significant-phase clock pulse to a least significant output terminal in response to coupling the intermediate phase clock pulse wave.

The foregoing discussion of the summary of the invention is provided only by way of introduction. Nothing in this section should be taken as a limitation on the claims, which define the scope of the invention. Additional objects and advantages of the present invention will be set forth in the description that follows, and in part will be obvious from the description, or may be learned by practice of the present invention. The objects and advantages of the present invention may be realized and obtained by means of the instrumentalities and combinations particularly pointed out in the claims.

DETAILED DESCRIPTION OF THE PRESENTLY PREFERRED EMBODIMENTS

The embodiments described herein relate to a PRML based read/write channel device. The read/write channel is coupled with the read/write heads of the hard drive. Herein, the phrase "coupled with" is defined to mean directly connected to or indirectly connected through one or more intermediate components. Such intermediate components may include both hardware and software based components. The read/write channel converts digital data from the host device into electrical impulses to control the read/write head to magnetically record data to the hard disk. During read operations, the read/write channel receives an analog waveform magnetically sensed by the read/write heads and converts that waveform into the digital data stored on the drive.

The illustrated embodiments provide a high speed zero phase restart for a PRML multiphase clock. The multiphase clock pulse waves are synchronized according to respective phases of the pulse waves. The time to restart the multiphase clock is reduced by sequentially coupling the pulse waves to output terminals.

Hereinafter embodiments of the present invention will be explained with reference to accompanied FIGS. 1 through 4.

Figure 1A:
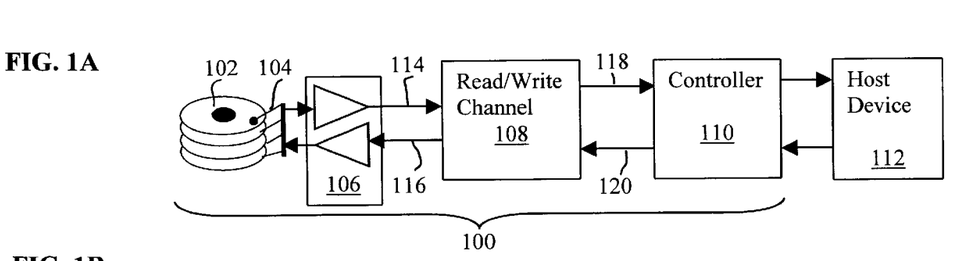
FIG. 1A depicts block diagram of an exemplary hard drive coupled with a host device.

Referring to FIG. 1A, a block diagram for a hard drive 100 coupled with a host device 112 is shown. For clarity, some components, such as a servo/actuator motor control, are not shown. The drive 100 includes the magnetic surfaces and spindle motor 102, the read/write heads and actuator assembly 104, pre-amplifiers 106, a read/write channel 108 and a controller 110. The pre-amplifiers 106 are coupled with the read/write channel 108 via interfaces 114, 116. The controller 110 interfaces with the read/write channel 108 via interfaces 118, 120.

For reads from the hard disk 100, the host device 112 provides a location identifier that identifies the location of the data on the disk drive, e.g. a cylinder and sector address. The controller 110 receives this address and determines the physical location of the data on the platters 102. The controller 110 then moves the read/write heads into the proper position for the data to spin underneath the read/write heads 104. As the data spins underneath the read/write head 104, the read/write head 104 senses the presence or absence of flux reversals, generating a stream of analog signal data. This data is passed to the pre-amplify 106 which amplifies the signal and pass the data to the read/write channel 108 via the interface 114. As will be discussed below, the read/write channel receives the amplified analog waveform from the pre-amplifiers 106 and decodes this waveform into the digital binary data that it represents. This digital binary data is then passed to the controller 110 via the interface 118. The controller 110 interfaces the hard drive 100 with the host device 112 and may contain additional functionality, such as caching or error detection/correction functionality, intended to increase the operating speed and/or reliability of the hard drive 100.

For write operations, the host device 112 provides the controller 110 with the binary digital data to be written and the location, e.g. cylinder and sector address, of where to write the data. The controller 110 moves the read/write heads 104 to a designated location and sends the binary digital data to be written to the read/write channel 108 via interface 120. The read/write channel 108 receives the binary digital data, encodes it and generates analog signals which are used to drive the read/write head 104 to impart the proper magnetic flux reversals onto the magnetic platters 102 representing the binary digital data. The generated signals are passed to the pre-amplifiers 106 via interface 116 which drive the read/write heads 104.

Figure 1B:
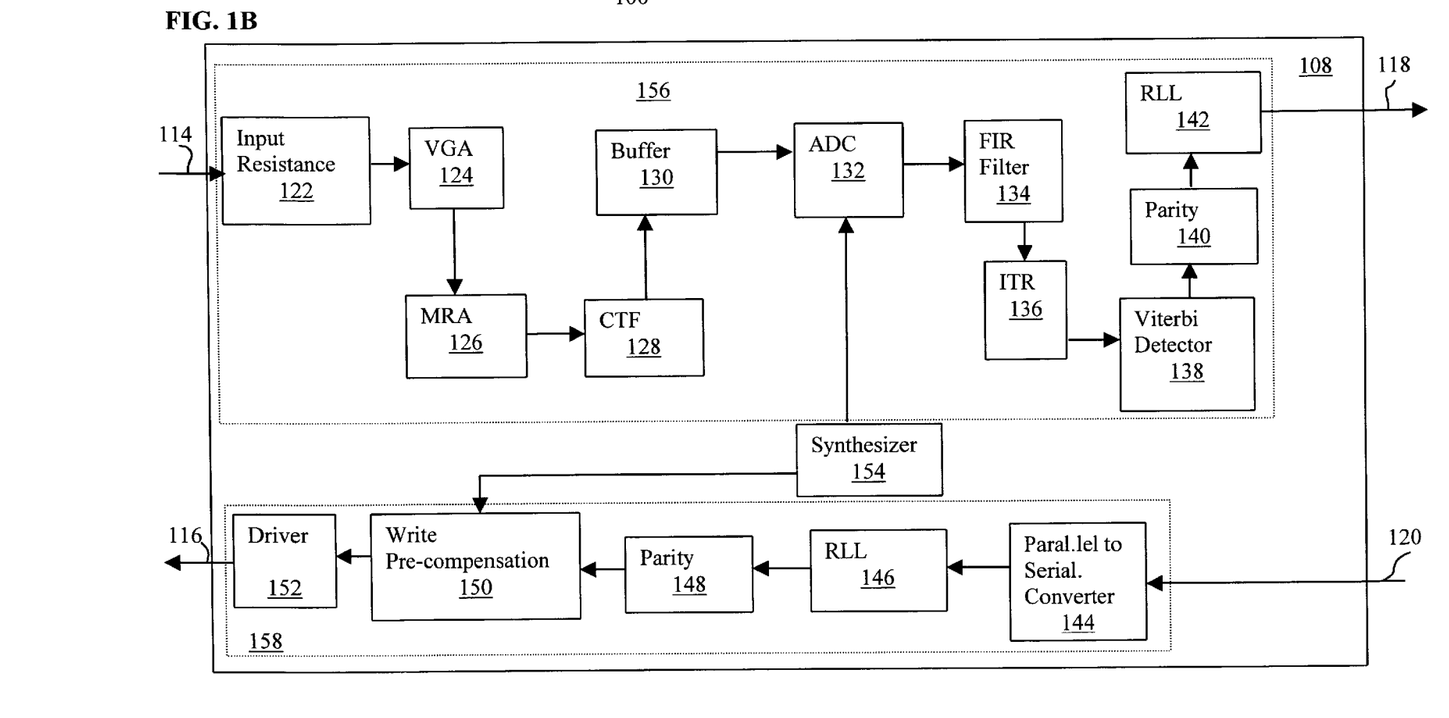
FIG. 1B depicts a block diagram of one embodiment of a read/write channel for use with a hard drive.

Referring to FIG. 1B, there is shown an exemplary read/write channel 108 supporting Partial Response Maximum Likelihood ("PRML") encoding technology for use with the hard drive 100 of FIG. 1A. For clarity, some components have been omitted. The read/write channel 108 is implemented as an integrated circuit using a complementary metal oxide semiconductor ("CMOS") process for transistors having an effective channel length of 0.18 micron. It will be appreciated that other process technologies and feature sizes may be used and that the circuitry disclosed herein may be further integrated with other circuitry comprising the hard disk electronics such as the hard disk controller logic. As was described, the read/write channel 108 converts between binary digital information and the analog signals representing the magnetic flux on the platters 102. The read/write channel 108 is divided into two main sections, the read path 156 and the write path 158.

The write path 158 includes a parallel to serial converter 144, a run-length-limited ("RLL") encoder 146, a parity encoder 148, a write pre-compensation circuit 150 and a driver circuit 152. The parallel to serial converter 144 receives data from the host device 112 via interface 120 eight bits at a time. The converter 144 serializes the input data and sends the serial bit stream to the RLL encoder 146. The RLL encoder 146 encodes the serial bit stream into symbolic binary sequences according to a known run-length limited algorithm for recording on the platters 102. The exemplary RLL encoder uses a 32/33 bit symbol code to ensure that flux reversals are properly spaced and that long runs of data without flux reversals are not recorded. The RLL encoded data is then passed to the parity encoder 148 that adds a parity bit to the data. In the exemplary parity encoder 148, odd parity is used to ensure that long run's of 0's and 1's are not recorded due to the magnetic properties of such recorded data. The parity-encoded data is subsequently treated as an analog signal rather than a digital signal. The analog signal is passed to a write pre-compensation circuit 150 that dynamically adjusts the pulse widths of the bit stream to account for magnetic distortions in the recording process. The adjusted analog signal is passed to a driver circuit 152 that drives the signal to the pre-amplifiers 106 via interface 116 to drive the read/write heads 104 and record the data. The exemplary driver circuit 152 includes a pseudo emitter coupled logic ("PECL") driver circuit that generates a differential output to the pre-amplifiers 106.

The read path 156 includes an attenuation circuit/input resistance 122, a variable gain amplifier ("VGA") 124, a magneto-resistive asymmetry linearizer ("MRA") 126, a continuous time filter ("CTF") 128, a buffer 130, an analog to digital converter ("ADC") 132, a finite impulse response ("FIR") filter 134, an interpolated timing recovery ("ITR") circuit 136, a Viterbi algorithm detector 138, a parity decoder 140 and a run-length-limited ("RLL") decoder 142. The amplified magnetic signals sensed from the platters 102 by the read/write head 104 are received by the read/write channel 108 via interface 114. The analog signal waveform representing the sensed magnetic signals is first passed through an input resistance 122 that is a switching circuit to attenuate the signal and account for any input resistance. The attenuated signal is then passed to a VGA 124 that amplifies the signal. The amplified signal is then passed to the MRA 126 that adjusts the signal for any distortion created by the recording process. Essentially, the MRA 126 performs the opposite function of the write-pre-compensation circuit 150 in the write path 158. The signal is next passed through the CTF 128, which is essentially a low pass filter, to filter out noise. The filtered signal is then passed to the ADC 132 via the buffer 130 that samples the analog signal and converts it to a digital form. The digital signal is then passed to a FIR filter 134 and then to a timing recovery circuit 136. The timing recovery circuit 136 is connected (not shown in the figure) to the FIR filter 134, the MRA 126 and the VGA 124 in a feedback orientation to adjust these circuits according to the signals received to provide timing compensation. The exemplary FIR filter 134 is a 10 tap FIR filter. The digital signal is then passed to the Viterbi algorithm detector 138 that determines the binary bit pattern represented by the digital signal using digital signal processing techniques. The exemplary Viterbi algorithm detector 138 uses a 32 state Viterbi processor. The binary data represented by the digital signal is then passed to the parity decoder 140, which removes the parity bit, and then to the RLL decoder 142. The RLL decoder 142 decodes the binary RLL encoding symbols to the actual binary data. This data is then passed to the controller 110 via the interface 118.

The read/write channel 108 further includes a clock synthesizer 154. The clock synthesizer 154 generates a multiphase clock signal required for operating the read/write channel 108. The exemplary clock synthesizer 154 includes a phased lock look ("PLL") with a voltage controlled oscillator and various clock dividers to generate the necessary multiphase clock signal.

Figure 2:
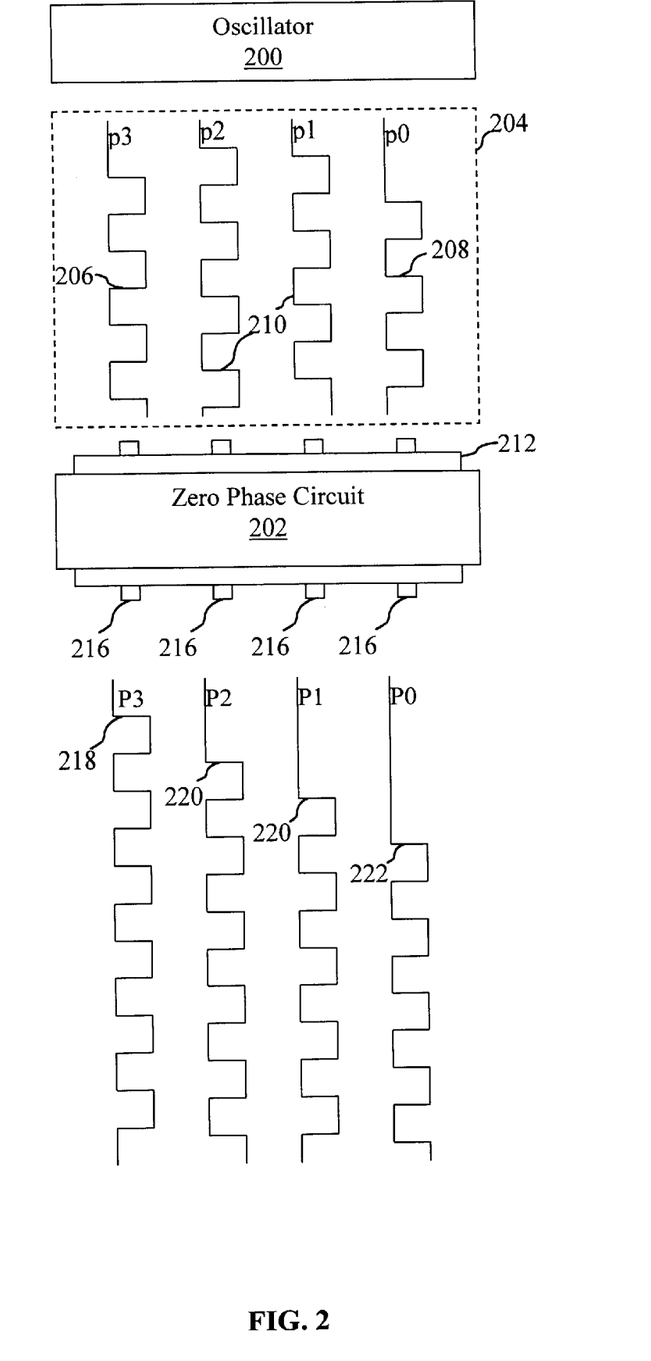
FIG. 2 is a timing diagram for one embodiment including output for a zero phase restart of a multiphase a clock signal.

Referring to FIG. 2, an exemplary oscillator circuit 200 and a high speed zero phase restart circuit 202 are shown. The oscillator circuit 200 may be a voltage controlled oscillator that generates a multiphase clock signal 204 having a frequency dependent on a voltage input. The multiphase clock signal 204 may be multiplexed to independent channels or may be combined to a single channel. The multiphase clock signal 204 comprises a plurality of clock pulse waves with each clock signal pulse wave having substantially equal frequency (period) and each clock pulse wave being out of phase with respect to the other clock pulse waves. For example a clock signal 204 has four pulse waves, including a most-significant-phase pulse wave (p3) 206, a least-significant-phase pulse wave (p0) 208, and two intermediate-phase pulse waves (p2, p1) 210. The least-significant-phase pulse wave 208 is generally associated with phase zero of the multiphase clock signal 204, while the most-significant-phase pulse wave 206 is generally associated with the pulse wave having a largest delay from phase zero of the multiphase clock signal 204. The intermediate-phase pulse waves 210 include discrete clock pulse waves having a phase between the least-significant-phase pulse wave and the most-significant-phase pulse wave. Oscillator circuits 200 generating fewer or more, such as sixteen or thirty-two phases may be used.

At power up, the oscillator circuit 200 provides an unsynchronized multiphase clock signal 204. The multiphase clock signal 204 is communicated to an input 212 of the zero phase restart circuit 202. The input 212 comprises one or more input terminals. The zero phase restart circuit is configured to couple the clock signal 204 to an output 214. The output 214 comprises a plurality of output terminals 216, with at least one output terminal 216 for each of the clock pulse waves 206, 208, 210 of the multiphase clock signal 204.

As explained further below, the zero phase restart circuit 202 sequentially couples each of the clock pulse waves 206, 208, 210 to the corresponding output terminal 216 according to phase of the clock pulse wave 206, 208, 210. By way of example, the zero phase restart circuit 202 couples the most-significant-phase pulse wave 206 to the corresponding output terminal 216 during a first period 218 of the most-significant-phase pulse wave. The zero phase restart circuit 202 couples the least-significant-phase pulse wave (pulse wave N) 208 to the corresponding output terminal 216 during an Nth period 222 of the least-significant pulse wave 208, where N equals the number of clock pulse waves 206, 208, 210. In one embodiment, the Nth period immediately follows the first period in time.

During an intermediate period 220, the zero phase restart circuit 202 independently and sequentially couples the intermediate-phase pulse waves 210 to corresponding output terminals 216. Each of the intermediate phase pulse waves is coupled during a respective successive period of the intermediate-phase pulse wave 210. In one embodiment, the intermediate period immediately follows the first period in time and the Nth period immediately follows the intermediate period in time.

Figure 3:
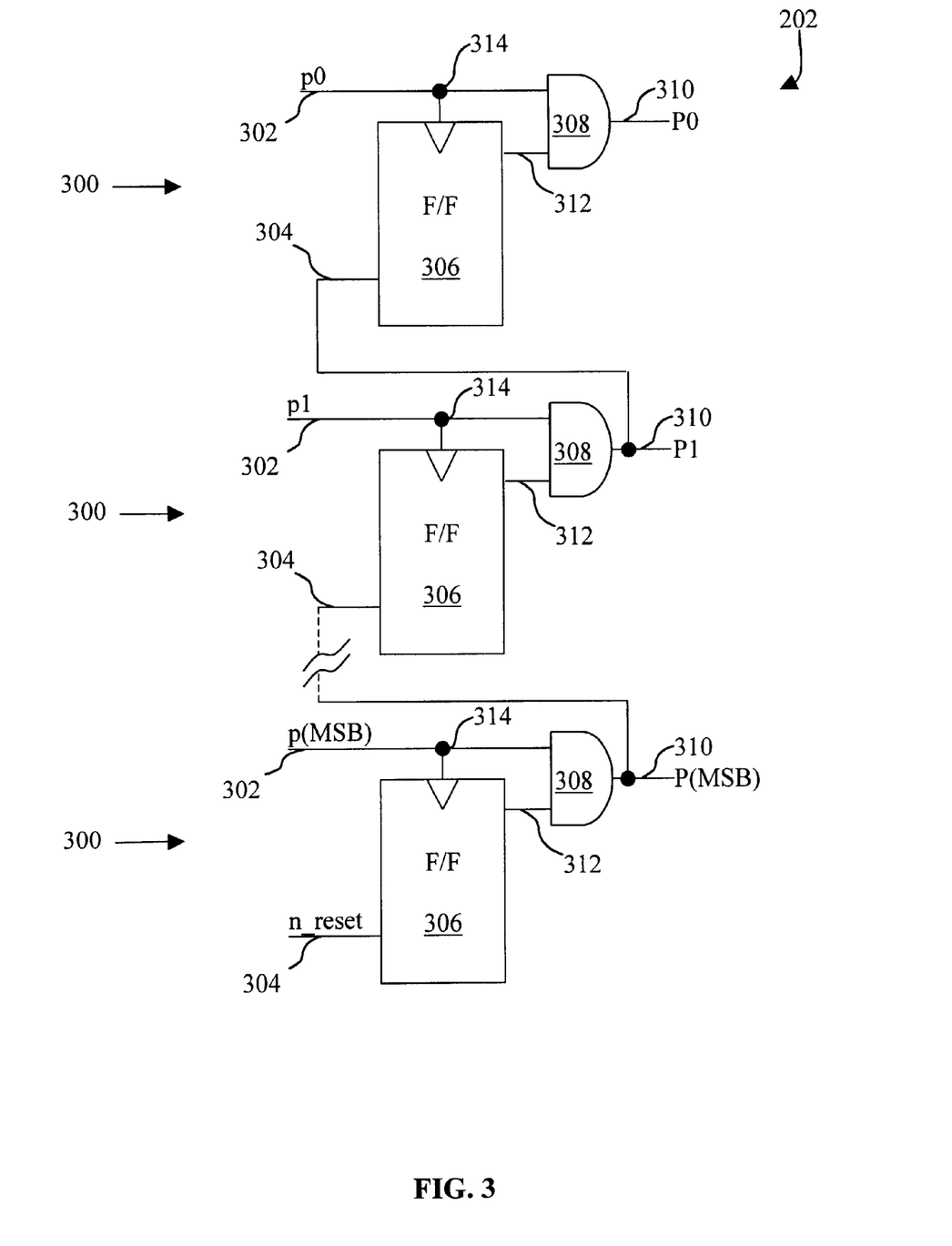
FIG. 3 is a schematic diagram of one embodiment of a high speed zero phase restart circuit.

Referring to FIG. 3, an example of the zero phase restart circuit 202 of FIG. 1 is shown. The zero phase restart circuit 202 comprises an ASIC, a DSP, discrete hardware, a processor or other devices. The zero phase restart circuit 202 has a phase restart stage 300 for each clock pulse wave 206, 208, 210. Each restart stage further comprises clock pulse wave input 302, a flip-flop 306, a logic gate 308, and a clock pulse wave output 310. The flip-flop 306 may be any suitable logic design having memory capabilities and having at least one output 312, such as a D-type flip-flop, an S/R-type flip-flop, or a J/K-type flip-flop. The flip-flop 306 comprises at least a first input 304 and a second input 314. The logic gate 308 maybe any suitable multiple input single output digital logic device, such as an AND gate, a NAND gate, a multiplexer, and OR gate, or a NOR gate or any combination thereof.

For each restart stage 300, a clock pulse wave 206, 208, 210 corresponding to the restart stage 300 is electrically communicated with the second input 314 of the flip-flop 306 and with an input for the logic gate 308. The output 312 of the flip-flop 306 is electrically coupled to an input for the logic gate 308. For each restart stage 300 except for the restart stage corresponding to the most-significant-phase pulse wave p(MSB), the first input 304 is electrically coupled to the output 312 corresponding to the clock pulse wave 206, 208, 210 immediately preceding the restart stage 300. The first input 304 corresponding to the restart stage for the most-significant-phase clock pulse wave p(MSB) is configured to receive a reset input signal (n_reset).

At power up, the n_reset signal is "0," setting the output 312 to "0" and setting the pulse wave output 310 for each restart stage 300 to "0." When the n_reset signal is set to "1," the output 312 for the flip-flop 306 corresponding to the most-significant-phase pulse wave p(MSB) 206 is set to "1" during a next period of the clock signal of the most-significant-phase pulse wave 206. When the output 312 for the most-significant-phase pulse wave is set to "1," the corresponding logic gate 308 couples the most-significant-phase pulse wave 206 to the pulse wave output P(MSB) 310. The most-significant-phase pulse wave 206 remains coupled to the pulse wave output 310 until an n_reset signal is received.

The most-significant-phase pulse wave 206 is also communicated with a restart stage 300 corresponding to a pulse wave immediately succeeding the most-significant-phase pulse wave 206 according to phase of the clock signal 204. In one embodiment, a restart stage 300 for the intermediate-phase pulse wave 210 immediately succeeds a restart stage for the most-significant-phase pulse wave 206 and a restart stage for the least-significant-phase pulse wave 206 immediately succeeds the intermediate-phase pulse wave 210.

The most-significant-phase pulse wave 206 propagates as a control signal via the pulse wave output 310 to the first input for the intermediate-phase restart stage 300. When the most-significant-phase pulse wave 206 is set to "1," at the first input 304, the intermediate-phase flip/flop 306 sets the output 312 to "1" during a next period of the intermediate-phase pulse wave 210. When the output 312 is set to "1," the corresponding intermediate-phase logic gate 308 couples the intermediate-phase pulse wave 210 to the pulse wave output P(MSB) 310.

When the intermediate-phase pulse wave is coupled to the corresponding pulse wave output 310, the intermediate-phase pulse wave 210 propagates as a control signal to the least-significant-phase restart stage 300. In response, the corresponding least-significant-phase flip/flop 306 and logic gate 308 couple the least-significant-phase pulse wave 208 to the pulse wave corresponding pulse wave output 310. The least-significant-phase pulse wave 208 is coupled to the corresponding pulse wave output 310 during a next period of the least-significant-phase pulse wave 208. In one embodiment, the least-significant-phase pulse wave 208 is coupled with the corresponding pulse wave output 310 during an Nth period for the least-significant-phase pulse wave, where N is the number of pulse waves for the clock signal 204.

In one embodiment, the intermediate-phase restart stage 300 sequentially couples multiple intermediate-phase pulse waves 210 to the corresponding pulse wave outputs 310. The intermediate-phase restart stage 300 is configured to sequentially couple the intermediate-phase pulse waves 210 according to the pulse wave phase during a corresponding period of the intermediate phase pulse wave 210. When an intermediate-phase pulse wave 210 is coupled with the corresponding pulse wave output 310, the intermediate-phase pulse wave 210 propagates as a control signal to a succeeding flip/flop 306.

In one embodiment, the least-significant-phase restart stage 300 immediately succeeds the most-significant-phase restart stage 300. When the most-significant-phase pulse wave is coupled to the corresponding pulse wave output 310, the most-significant-phase pulse wave 206 propagates as a control signal to the least significant phase restart stage 300. The most-significant-phase pulse wave 206 is received at the first input 304 for the least-significant-phase flip/flop. In response, the flip/flop 306 and corresponding logic gate 308 couple the least-significant-phase pulse wave 208 to the corresponding pulse wave output 310.

Figure 4:
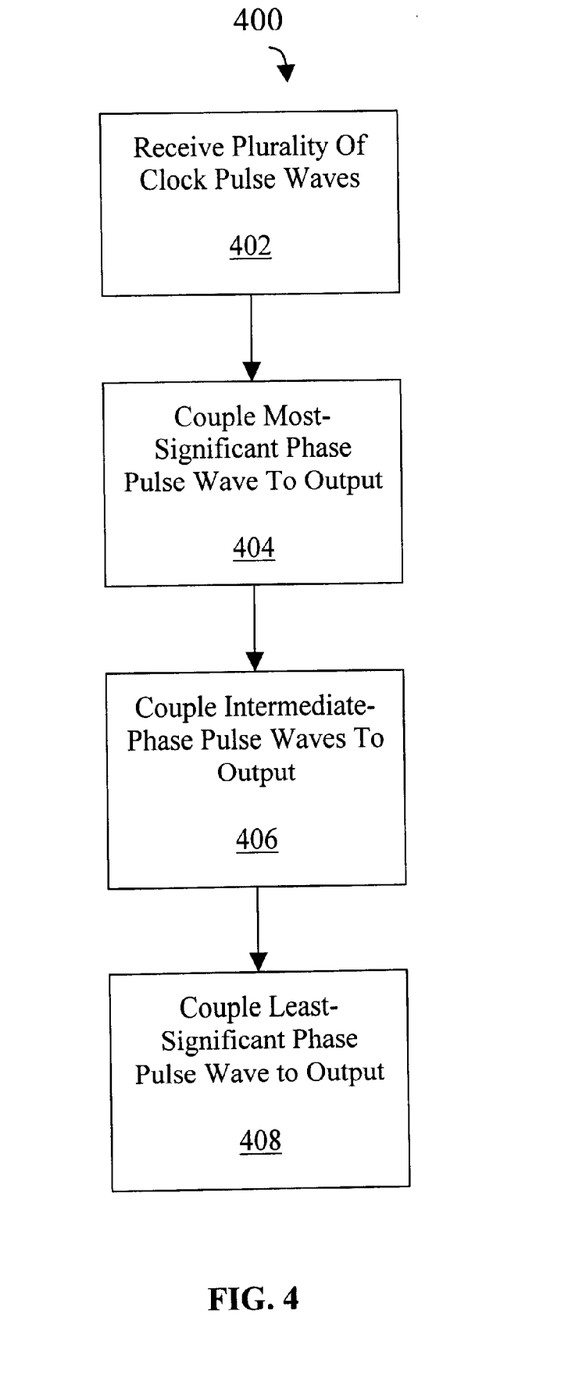
FIG. 4 is a flow chart according to an example for a method for a high speed zero phase restart for a multiphase clock.

Referring to FIG. 4, a flowchart for a method for restarting a multiphase clock signal sequentially is shown. The method includes the acts of receiving 402 a plurality of clock pulse waves; coupling 404 a most-significant-phase pulse wave to a most-significant output terminal during a first clock period; coupling 406 one or more intermediate-phase pulse waves to intermediate output terminals during an intermediate clock period; and coupling 408 a least-significant-phase pulse wave to a least-significant output terminal during an Nth clock period, where N is the number of clock pulse waves received.

The plurality of clock pulse waves received in act 402 each have substantially the same frequency (period). Each clock pulse wave is substantially out of phase with respect to the other clock pulse waves. The plurality of clock pulse waves further includes a most-significant-phase clock pulse wave, a least-significant-phase pulse wave and one or more intermediate-phase clock pulse wave. In a preferred embodiment, the number of clock pulse waves is 16. N may be any number greater than 1.

During the act 404 of coupling the most-significant-phase pulse wave, the most-significant-phase pulse wave is coupled to the most-significant-phase output terminal in response to a reset signal. In one embodiment, the most-significant phase pulse wave remains coupled until a further reset signal is communicated.

During the act 406 of coupling one or more intermediate-phase pulse waves 406, the intermediate-phase pulse waves are coupled to intermediate output terminals in response to the act 404 of coupling the most-significant-phase pulse wave or preceding intermediate pulse wave. The intermediate clock period immediately follows the first clock period in time. In one embodiment, the intermediate period comprises multiple consecutive clock periods during which respective multiple consecutive intermediate-phase pulse waves are sequentially coupled to corresponding intermediate outputs.

During the act 408 of coupling the least-significant-phase pulse wave to the least-significant output terminal, the least-significant-phase pulse wave is coupled to a least-significant output terminal in response to coupling one of the intermediate phase clock pulse waves. In one embodiment, the Nth clock period immediately follows the intermediate clock period in time.

As heretofore mentioned, high speed zero phase restart of a multiphase clock can be obtained. The present embodiment is applicable to sequentially synchronizing a multiphase clock signal for a phase locked loop ("PLL") in a PRML read/write channel design. The oscillator circuit may comprise a voltage controlled oscillator that generates a multiphase clock signal having a variable frequency. The multiphase clock signal includes multiple clock pulse waves with each clock pulse being out of phase with respect to the other pulse waves. The voltage controlled oscillator further varies the frequency of the multiphase clock signal based on a voltage level communicated with the voltage controlled oscillator.

The method is not limited to the circuits as shown in FIGS. 1–4 and described above. Various implementations of the method for a zero phase restart of a multiphase clock can be realized that are within the scope of the present invention. All of the components for the zero phase restart of a multiphase clock may be integrated with the PRML read/write channel on a single integrated circuit semiconductor chip. Alternatively, some or all of the components of the circuit according to the principles of the present invention may be implemented in one or more integrated circuits external to a PRML read/write channel design.

While particular embodiments of the present invention have been shown and described, modifications may be made. It is therefore intended in the appended claims, including all equivalents, cover all such changes and modifications.

What is claimed is:

1. An integrated circuit, comprising:
   an input configured for a multiphase clock signal including a plurality of clock pulse waves, each clock pulse wave being out of phase with respect to each other clock pulse wave, wherein the clock pulse waves include a most-significant-phase clock pulse wave and a least-significant-phase clock pulse wave;
   an output having a plurality of output terminals corresponding to respective ones of the plurality of clock pulse waves; and
   a zero phase circuit electrically coupled with the input and the output and configured to couple the plurality of clock pulse waves to the corresponding output terminals sequentially in time from the most-significant-phase clock pulse wave to the least significant phase clock pulse wave.

2. The integrated circuit according to claim 1, wherein the zero phase circuit is configured to independently couple the clock pulse waves to the corresponding output terminal during a respective period of the clock pulse wave.

3. The integrated circuit according to claim 2, wherein the plurality of clock pulse waves includes at least one intermediate-phase pulse wave.

4. The integrated circuit of claim 3, wherein the zero phase circuit is operative in response to a reset input signal.

5. The integrated circuit of claim 4, wherein the zero phase circuit comprises at least one restart stage for a corresponding one of the plurality of clock pulse waves, the restart stage arranged to couple the corresponding clock pulse wave to the output in response to a control signal.

6. The integrated circuit of claim 5, wherein the restart stage comprises:
   (a) a flip/flop configured to propagate a control signal; and
   (b) a logic gate coupled with the flip/flop output and arranged to couple the corresponding clock pulse wave to the output responsive to the control signal.

7. The integrated circuit of claim 6, wherein the flip/flop is a D-type flip/flop and the logic gate is an AND gate.

8. A method for sequentially restarting a multiphase clock signal, the method comprising the acts of:
   (a) receiving a plurality of (N) clock pulse waves, each being substantially out of phase with respect to each of the other plurality of clock pulse waves and wherein the plurality of clock pulse waves includes a most-significant-phase pulse wave and at least one least significant-phase pulse wave;
   (b) coupling the most-significant-phase pulse wave to a most significant output terminal during a first clock period; and
   (c) sequentially coupling after (b) the least-significant-phase clock pulse to a least significant output terminal during an Nth clock period, wherein N equals the number of clock pulse waves.

9. The method of claim 8, further comprising the act of sequentially coupling after (b) at least one intermediate-phase pulse wave to an intermediate output terminal during an intermediate clock period.

10. The method of claim 9 further comprising sequentially coupling a plurality of intermediate-phase pulse waves to a corresponding intermediate output terminal in corresponding intermediate clock periods.

11. A method for synchronizing a multiphase clock signal in a PRML read/write channel, the method comprising the acts of:
   (a) receiving a plurality of (N) clock pulse waves, each being substantially out of phase with respect to each of the other plurality of clock pulse waves and wherein the N clock pulse waves includes a most-significant-phase pulse wave and a least-significant-phase pulse wave; and
   (b) sequentially coupling the plurality of clock pulse waves as a function of phase from the most-significant-phase pulse wave to the least-significant-phase pulse wave.

12. A computer hard disk drive, comprising:
   (a) a partial response maximum likelihood read/write channel having an oscillator circuit arranged to generate a plurality of clock signals, the clock signals being out of phase with respect to each other clock signal;
   (b) a respective plurality of logic gates coupled with the oscillator circuit and arranged to pass the clock signals to respective output terminals in response to a control signal; and
   (c) a plurality of respective flip/flops arranged to sequentially propagate the control signal in response to a reset signal.

* * * * *

UNITED STATES PATENT AND TRADEMARK OFFICE
CERTIFICATE OF CORRECTION

PATENT NO. : 6,700,722 B2
DATED : March 2, 2004
INVENTOR(S) : Michael A. Ruegg et al.

It is certified that error appears in the above-identified patent and that said Letters Patent is hereby corrected as shown below:

Title page,
Item [56], References Cited, U.S. PATENT DOCUMENTS, delete "5,552,942 A" and substitute -- 5,552,942 B1 -- in its place; delete "6,044,122 A" and substitute -- 6,044,122 B1 -- in its place.
Insert the following references:
-- 3,911,368    10/1975        Tarczy-Hornoch
   5,258,877    11/1993        Leake et al.
   09/430,531                  Chen et al. --
Insert the following:
-- FOREIGN PATENT DOCUMENTS
EP      0 70 1255 A3       3/1996        PCT --.
OTHER PUBLICATIONS, insert:
-- "Synchronizer for Multiphase Clocks" IBM Technical Disclosure
Bulletin, IBM Corp. New York, U.S., vol. 33, no. 1A June 1, 990.
pgs. 410-412. --
"Reference Guide–Hard Disk Drives" reference, before "13" delete "hdd." and substitute -- hdd, -- in its place.

Signed and Sealed this

Twenty-second Day of March, 2005

JON W. DUDAS
*Director of the United States Patent and Trademark Office*